(12) United States Patent
Otremba et al.

(10) Patent No.: US 7,528,010 B2
(45) Date of Patent: May 5, 2009

(54) SEMICONDUCTOR COMPONENT AND METHOD FOR PRODUCING THE SAME

(75) Inventors: Ralf Otremba, Kaufbeuren (DE); Josef Hoeglauer, Munich (DE); Matthias Stecher, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 11/778,887

(22) Filed: Jul. 17, 2007

(65) Prior Publication Data

US 2008/0012119 A1 Jan. 17, 2008

(30) Foreign Application Priority Data

Jul. 17, 2006 (DE) ............... 10 2006 033 319

(51) Int. Cl.
*H01L 21/00* (2006.01)
(52) U.S. Cl. ................... 438/107; 438/106
(58) Field of Classification Search ............... 438/106, 438/107, 113, 114, 125, 126, 118, 127, 458, 438/462
See application file for complete search history.

(56) References Cited

U.S. PATENT DOCUMENTS

| | | | |
|---|---|---|---|
| 6,432,743 B2 * | 8/2002 | Shimada | 438/107 |
| 6,858,799 B2 * | 2/2005 | Hedler et al. | 174/546 |
| 7,009,288 B2 | 3/2006 | Bauer et al. | |
| 7,033,860 B2 * | 4/2006 | Watanabe | 438/107 |
| 2001/0016369 A1 | 8/2001 | Zandman et al. | |
| 2002/0038890 A1 | 4/2002 | Ohuchi | |
| 2004/0084770 A1 | 5/2004 | Skocki | |
| 2005/0104165 A1 | 5/2005 | Ishio et al. | |
| 2005/0121795 A1 | 6/2005 | Mauder | |

FOREIGN PATENT DOCUMENTS

| | | |
|---|---|---|
| DE | 10332009 | 2/2005 |
| DE | 10351028 | 6/2005 |
| WO | 0178144 | 10/2001 |

\* cited by examiner

*Primary Examiner*—Roy K Potter
(74) *Attorney, Agent, or Firm*—Dicke, Billig, Czaja PLLC

(57) ABSTRACT

A semiconductor component of semiconductor chip size includes a semiconductor chip. The semiconductor chip has a metallic coating that completely covers the edge sides and the rear side and partly covers the top side, on which surface-mountable external contacts are arranged. One aspect includes power semiconductor components, wherein the metallic coating connects a rear side electrode to one of the surface-mountable external contacts on the top side of a power semiconductor chip.

10 Claims, 9 Drawing Sheets

US 7,528,010 B2

SEMICONDUCTOR COMPONENT AND METHOD FOR PRODUCING THE SAME

CROSS-REFERENCE TO RELATED APPLICATIONS

This Utility Patent Application claims priority to German Application No. DE 10 2006 033 319.5, filed Jul. 17, 2006, which is herein incorporated by reference.

BACKGROUND

An aspect of the invention relates to a semiconductor component of semiconductor chip size including a semiconductor chip, and a method for producing the same. One aspect relates to power semiconductor components having surface-mountable external contacts and having a rear side electrode that is to be connected to the surface-mountable external contacts.

A power semiconductor component of this type is known from the document WO 01/78144 A1. Appended FIG. 17 illustrates a schematic cross section through a power semiconductor component 31 of this type comprising through contacts 32 that are introduced through a silicon chip 3 to the rear side 7 of the silicon chip 3 in order to connect a drain electrode D as rear side electrode 13 to a plurality of surface-mountable external contacts 9 on the top side 8 of the power semiconductor component 31 of semiconductor chip size. In this case, the through contacts 32 form connecting elements 12 that expand to form external contact areas 33 on the top side 8 of the semiconductor chip 3 and are provided with coatings 34 on which are soldered solder balls 35 as surface-mountable external contacts 9 which together form a surface-mountable drain terminal D. A large-area power electrode 18 for the source terminal S of the power semiconductor component 31 is equipped with a plurality of further solder balls 35 as external contacts 9. The high current loading between source and drain terminals is thus distributed between a plurality of solder balls 35.

The drain electrode D on the rear side 7 is furthermore protected against damage by an insulating rear side substrate 36, while the edge sides 5 and 6 of the semiconductor chip 3 have neither a protection nor a coating and are therefore exposed to mechanical damage.

With the power semiconductor component 31, a considerable proportion of the volume of the silicon chip 3 is lost due to the introduction of the through contacts 32 in the useable semiconductor volume of the silicon chip 3. Furthermore, the current-carrying capacity of the silicon power semiconductor component 31 is significantly limited by the limited number of possible through contacts 32 through the semiconductor chip 3. Finally, complex and cost-intensive fabrication is involved with such a power semiconductor device 31, including connecting elements 12 in the form of through contacts 32 through the semiconductor chip 3.

The document U.S. Pat. No. 6,858,799 B2 discloses the semiconductor device 27 represented in appended FIG. 16. The semiconductor device 27 in FIG. 16 differs from the power semiconductor component 31 in FIG. 17 by virtue of the fact that the semiconductor device 27 in FIG. 16 of semiconductor chip size is protected against mechanical damage by a plastic coating 37 on the rear side 7 and the edge sides 5 and 6. The top side 8 carries an active integrated circuit, which can be connected to a superordinate circuit board by soldering by using surface-mountable external contacts 9 in the form of solder balls 35. A connecting element such as is known from the document WO 01/78144 A1 is not provided, however, for the semiconductor component 27 represented in FIG. 16. Consequently, it is not possible to connect the rear side 7 to the surface-mountable external contacts 9 on the top side 8 in the case of the semiconductor component 27 of semiconductor chip size.

For these and other reasons there is a need for the present invention.

SUMMARY

One aspect of the invention relates to semiconductor components of semiconductor chip size. The semiconductor chip has a metallic coating that completely covers the edge sides and the rear side and partly covers the top side, on which surface-mountable external contacts are arranged. One aspect includes power semiconductor components, wherein the metallic coating connects a rear side electrode to one of the surface-mountable external contacts on the top side of a power semiconductor chip.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 3 illustrates a schematic cross section through a portion of a semiconductor wafer with an introduced separating joint in the form of a separating groove.

FIG. 4 illustrates a schematic cross section through the portion of the semiconductor wafer in accordance with FIG. 3 after the application of an insulation and passivation layer.

FIG. 5 illustrates a schematic cross section through the portion of the semiconductor wafer in accordance with FIG. 4 after the patterning of the insulation and passivation layer.

FIG. 6 illustrates a schematic cross section through the portion of the semiconductor wafer in accordance with FIG. 5 after the application of an electrically conductive seed layer.

FIG. 7 illustrates a schematic cross section through the portion of the semiconductor wafer in accordance with FIG. 6 after the application of a patterned resist protective layer.

FIG. 8 illustrates a schematic cross section through the portion of the semiconductor wafer in accordance with FIG. 7 after the deposition of a metallic coating and surface-mountable external contacts.

FIG. 9 illustrates a schematic cross section through the portion of the semiconductor wafer in accordance with FIG. 8 after the removal of the resist protective layer structure.

FIG. 10 illustrates a schematic cross section through the portion of the semiconductor wafer in accordance with FIG. 9 after the removal of the electrically conductive seed layer.

FIG. 11 illustrates a schematic cross section through the portion of the semiconductor wafer in accordance with FIG. 10 after the thinning of the semiconductor wafer.

FIG. 12 illustrates a schematic cross section through the portion of the thinned semiconductor wafer in accordance with FIG. 11 after the metallization of the rear side of the semiconductor wafer.

FIG. 13 illustrates a schematic cross section through the portion of the thinned semiconductor wafer in accordance with FIG. 12 after the separation of the rear side metallization and thus of the semiconductor wafer into individual semiconductor components of semiconductor chip size.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

One embodiment of the invention provides a semiconductor component composed of a semiconductor chip which has a multifunctional coating which, on the one hand, can be produced in a cost-effective manner and, on the other hand, opens up a wide variety of possible uses for the semiconductor component.

One embodiment is achieved by using a semiconductor component composed of a semiconductor chip, wherein the semiconductor chip has a metallic coating that completely covers the edge sides and the rear side and partly covers the top side, on which surface-mountable external contacts are arranged.

Figure 16:
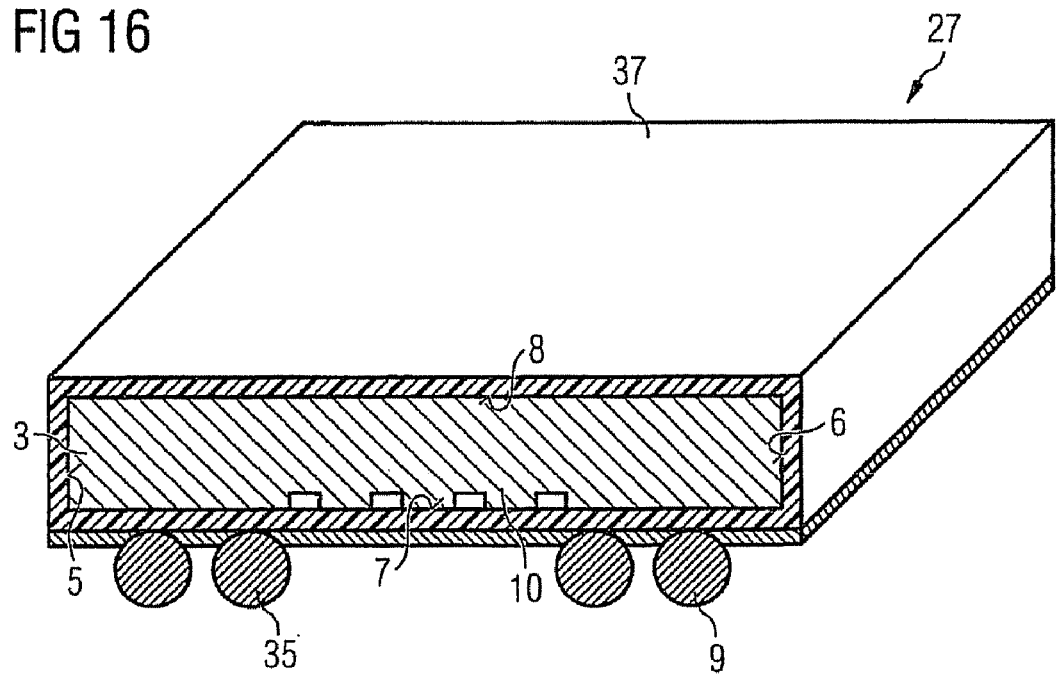
FIG. 16 illustrates a perspective view of a semiconductor component of semiconductor chip size in accordance with the prior art with a plastic coating.

One semiconductor component is protected against mechanical damage by the metallic coating that completely covers the edge sides and the rear side. Whereas a plastic coating, as illustrated in FIG. 16 from the prior art, can partly splinter off in the event of shock stress, the metallic coating is merely deformed plastically without the semiconductor material of the semiconductor chip being damaged; rather, the force that acts is attenuated by the metallic coating, on the one hand, and distributed over a larger area, on the other hand. Consequently, the metallic coating protects the semiconductor component of semiconductor chip size better than can be achieved by a plastic coating as known from the prior art.

In one embodiment of the invention, an insulation and/or passivation layer is arranged between the metallic coating and the semiconductor chip material. While pure insulation layers, by coating the semiconductor chip on the areas that are to be protected by the metallic coating, are possible in a simple manner by nitriding or oxidizing the semiconductor body or by coating with an insulation material such as polyamide, a passivation layer is expected to protect a pn-junction in the semiconductor component by the migration of ions from the insulation material in the direction of the pn-junction being impeded by the passivation layer. This is of particular importance for power semiconductor components of chip size, especially as pn-junctions in part reach as far as the edge sides 5 and 6 of the semiconductor chips.

In a further embodiment of the invention, the metallic coating is connected to a shielding potential. A shielding potential of this type is normally the lowest potential to which the semiconductor component is connected. By impressing a shielding potential on the metallic coating, the semiconductor component of semiconductor chip size can thus be shielded against electromagnetic interference fields. Furthermore, the metallic coating can be operatively connected to a heat sink. This operative connection can be realized by soldering a cooling element onto the metallic coating, with the result that the thermal stability of the semiconductor component is improved.

Figure 17:
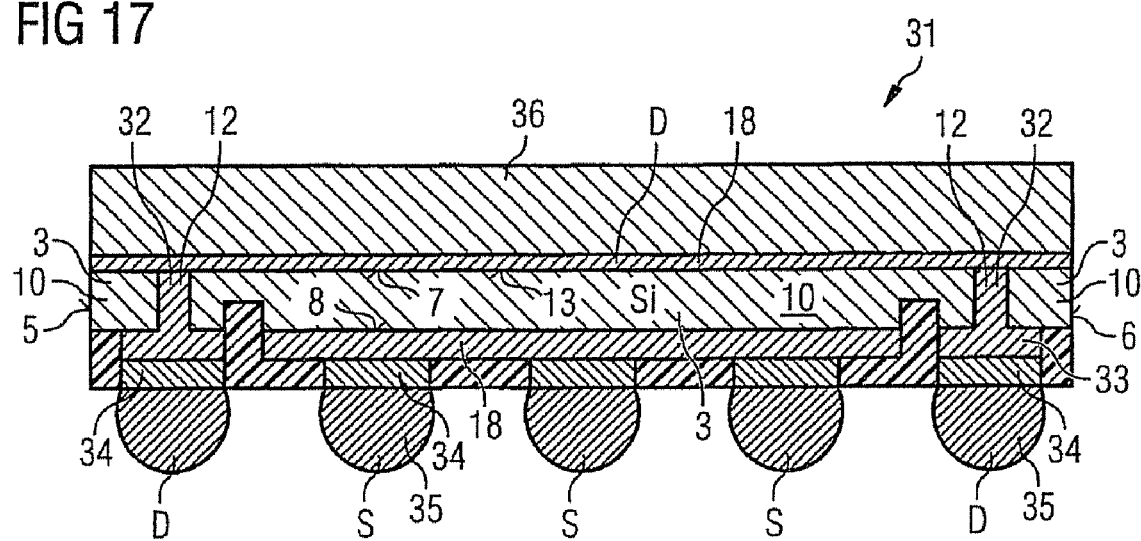
FIG. 17 illustrates a schematic cross section through a power semiconductor component with through contacts through the power semiconductor chip for connecting the rear side electrode to surface-mountable external contacts on the top side of the power semiconductor component.

Finally, it is possible to provide the metallic coating as a connecting element by producing an electrical connection between a rear side electrode of the semiconductor chip and an external contact of the semiconductor chip on the top side. This connecting element in the form of a metallic coating has the advantage over the through contacts such as are known from the document WO 01/78144 A1 in accordance with appended FIG. 17 with the power semiconductor component 31 that the current conducting cross section of the connecting element can be enlarged as desired by depositing a thicker coating on the rear side and on the edge sides and also on regions of the top side of the semiconductor chip. Furthermore, it is possible to produce this coating as a connecting element with significantly lower costs than the connecting elements in the form of through contacts 12 through the semiconductor material as illustrated in FIG. 17.

One embodiment provides a power semiconductor component including large-area power electrodes on top side and rear side of a power semiconductor chip and including a small-area control electrode on the top side of the power semiconductor chip, wherein the power semiconductor chip has a metallic coating that completely covers the edge sides and the rear side. The coating reaches as far as the top side, on which surface-mountable external contacts for the large-area power electrodes and the control electrode are arranged, with the result that the coating forms an electrical connecting element between the power electrode on the rear side and an external contact on the top side of the power semiconductor component.

Such a power semiconductor component with metallic coating has the large-area connection between rear side of the power semiconductor component and top side of the power semiconductor component and has the metallic coating that can additionally be used as shielding against electromagnetic interference fields. Furthermore, an insulation and/or passivation layer is arranged between the metallic coating and the semiconductor chip material, as has already been mentioned above. Finally, the metallic coating can be operatively connected to a heat sink in order to effectively dissipate the heat loss from the power semiconductor component.

In one embodiment of the invention, the power semiconductor component has a drain electrode of a MOSFET as power electrode of the rear side. The drain electrode is electrically connected to a surface-mountable drain external contact of the top side via the metallic coating. Consequently, both power electrodes for drain and source and also the control electrode for the gate are arranged on one side, namely the top side of the power semiconductor device of chip size, and can therefore be surface-mounted on a superordinate circuit board.

A further embodiment of the invention provides for the power electrode of the rear side to be a collector electrode of an IGBT (insulated gate bipolar transistor). The collector electrode of the IGBT is electrically connected to a surface-mountable collector external contact of the top side via the metallic coating.

In this case, too, all the electrodes are equipped with external contacts on a single side of the power semiconductor component, the collector electrode and the emitter electrode being formed in large-area fashion, while the control electrode or the insulated gate electrode is provided in small-area fashion.

The surface-mountable external contacts have mesa structures composed of solder material or composed of diffusion solder material or composed of a copper alloy. Mesa structures of this type form external contact areas that stand out above the level of the top side of the semiconductor chip, thereby facilitating soldering onto corresponding contact pads in the case of a superordinate circuit board. On the other hand, it is also possible for the surface-mountable external contacts of the power semiconductor chip composed of a metal such as copper, aluminum, gold or silver or alloys thereof to be covered by coatings having a solder material or a diffusion solder material.

Finally, it is also possible for the surface-mountable external contacts to be cohesively mounted on leads, in which case the cohesive mounting can be effected by using a diffusion solder material or a normal solder material and also be using conductive adhesives. With the aid of leads, it is possible to facilitate access to the surface-mountable external contacts on the top side of the semiconductor component of semiconductor chip size for the final customer.

A further embodiment of the invention provides for the power semiconductor component to have a power semiconductor chip thinned from the rear side. The thinning of the power semiconductor chips can be carried out while still in the state of the semiconductor wafer for a plurality of power semiconductor chips, so that after thinning a correspondingly mechanically stable and thick metal deposition provides a coating that ensures that the thinned semiconductor chip mechanically forms a self-supporting component embedded into a metallic coating. The handling of the thinned and enclosed semiconductor chip can thereby be facilitated in fabrication.

A method for producing a plurality of semiconductor components is also provided. Such method involves patterning a semiconductor wafer with semiconductor device structures with introduction of separating joints after fixing of the semiconductor wafer on a first carrier. Afterward, a resist protective layer structure is applied to the top side of the semiconductor wafer in regions that are to be protected against a deposition of a metallic encapsulation and metallic external contacts. A deposition of a metallic encapsulation and of metallic external contacts on the semiconductor wafer can then be effected, with the result that at least the sides of the separating joints are coated with the metallic encapsulation and the top side is coated partly with the metallic encapsulation and partly with metallic external contacts.

Afterward, the resist protective layer structure is removed and the semiconductor wafer is fixed by its top side on a second carrier. In addition, the first carrier is then removed from the rear side, with the result that the rear side of the semiconductor wafer is metallized with completion of the encapsulation of rear side, edge sides and regions of the top sides of the semiconductor components of the semiconductor wafer. A prerequisite for this is that during the introduction of the separating joints at the start of the method, the separating joints completely sever the semiconductor wafers. In that case, after the metallization of the rear sides, completed individual semiconductor components can be removed from the second carrier.

A modified method for producing a plurality of semiconductor components is also provided. The process involves producing a semiconductor wafer with a large-area rear side electrode and with semiconductor chip positions arranged in rows and columns with semiconductor component structures and separating tracks arranged in between. The semiconductor wafer is fixed by its rear side on a first carrier and separating joints are introduced along the separating tracks. An electrically conductive seed layer is then applied to the semiconductor wafer and the sidewalls of the separating joints. This is followed once again by an application of a patterned resist protective layer to the seed layer in regions that are to be protected against a deposition of a metallic encapsulation and a deposition of metallic external contacts.

This is followed by the deposition of a metallic encapsulation and the deposition of metallic external contacts on the uncovered seed layer. For this purpose, an electrical potential is applied to the seed layer and the metallic encapsulation with the external contacts is electrodeposited. After the deposition of the metallic encapsulation and the metallic external contacts on the seed layer, firstly the resist protective layer structure and then the seed layer are removed. Afterward, the semiconductor wafer is fixed by its top side on a second carrier and the first carrier is removed from the rear side. Finally, the rear side of the semiconductor wafer is metallized with completion of the encapsulation of rear sides, edge sides and regions of the top sides of the semiconductor components in the semiconductor chip positions.

Semiconductor components can then be removed from the second carrier. A prerequisite in this case, too, is that the separating joints sever the entire semiconductor wafer in the first process.

A further method for producing a plurality of power semiconductor components differs from the methods specified previously in that power semiconductor components have large-area power electrodes that are to be introduced as early as during the production of the semiconductor wafer with power semiconductor chip positions arranged in rows and columns. For this purpose, the top side of the semiconductor wafer has a power electrode and a control electrode in the respective power semiconductor chip positions, while the rear side forms the second power electrode. Moreover, separating tracks run between the power semiconductor chip positions as in the previous methods.

A semiconductor wafer of this type is then fixed by its rear side on a first carrier and separating joints can be introduced along the separating tracks. In these power semiconductor components, too, it is possible firstly to apply a seed layer, then to provide a resist protective layer structure on the seed layer and finally to deposit the metallic encapsulation and the metallic external contacts on the seed layer. After the removal of the resist protective layer structure and of the seed layer arranged underneath, the semiconductor wafer can then be fixed by its top side on a second carrier and the first carrier can be removed.

Finally, the rear side of the semiconductor wafer is metallized in order to complete the encapsulation of rear sides, edge sides and regions of the top sides of the power semiconductor components in the semiconductor chip positions, so that individual power semiconductor components can subsequently be removed from the second carrier. In all three method variants specified above, for contact-connecting a rear side electrode to surface-mountable external contacts on the top side of the semiconductor chip, no passage openings and passage holes have to be etched through the semiconductor body of the semiconductor chip or be produced in some other way. Rather, the separating tracks and the separating joints introduced along the separating tracks are used to provide a metallic encapsulation of the semiconductor chip and thus a connection between rear side and top side.

In all three methods, after the introduction of the separating joints, an insulation or passivation layer can be applied to the semiconductor wafer and to the sidewalls of the separating joints in order to ensure that the semiconducting material, in particular the pn-junctions in the semiconducting material, are not short-circuited by the metallic coating.

In a further method variant, in all three cases specified above, the separating joints are introduced in such a way that they do not completely sever the semiconductor wafer as early as at the beginning of the methods, rather that only separating grooves arise. It is only after the application of the second carrier that the semiconductor wafer with the separating grooves is thinned until the separating joints are reached to an extent such that individual semiconductor components of semiconductor chip size are present. A metallization is then applied to the thinned rear side of the semiconductor components in order to complete the encapsulation and to ensure the stability of the semiconductor devices of semiconductor ship size. With this method variant it is possible to produce extremely thin semiconductor components with a stable metallic coating. For power semiconductor components, this method variant affords the advantage that the substrate resistance can be minimized and the on resistance $R_{on}$ can therefore be optimized.

Furthermore, an electroless chemical deposition for the deposition of a metallic encapsulation and for the deposition of metallic external contacts is provided, since the deposition manages without the abovementioned seed layer in the last two method variants. On the other hand, it is also possible, if a seed layer is present, to carry out an electrolytic metal deposition. A sputtering method is used for the deposition of an electrically conductive seed layer.

A plasma ashing or a solvent can be used for the removal of the resist protective layer structure. In the case of plasma ashing, the resist protective layer is practically burnt in an oxidizing plasma, while in the case of a removal by using a solvent, the resist protective layer structure has to be soluble in the solvent. A dry etching method can be used for the removal of the seed layer, in which method the seed layer is sputter-disintegrated by ion bombardment; no patterning mask is required for this purpose, especially as the seed layer thickness to be sputter-disintegrated has a minimal fraction of the deposited thickness of the metallic coating and of the external contacts.

Figure 1:
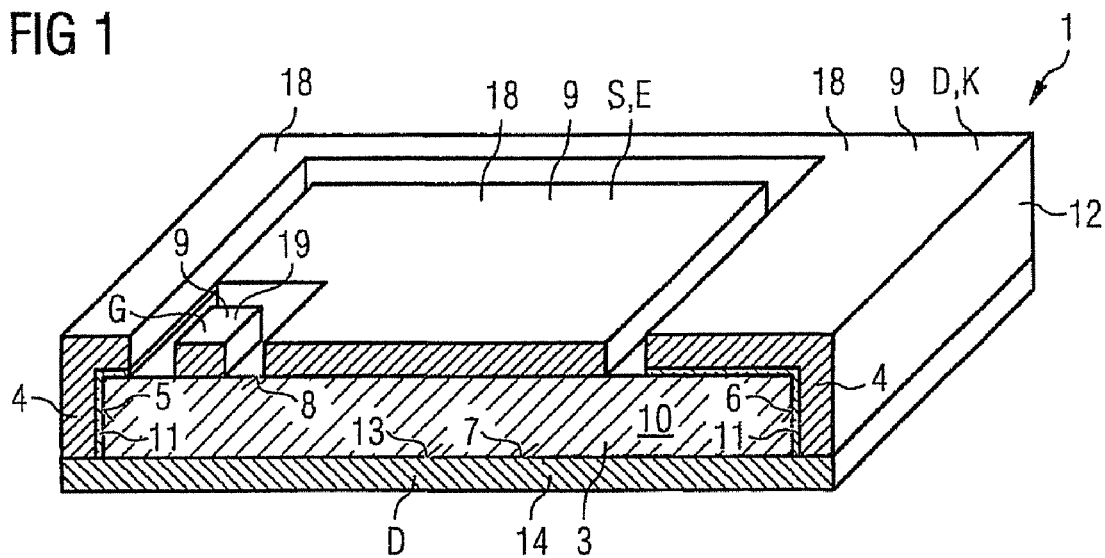
FIG. 1 illustrates a basic perspective view of a power semiconductor component of semiconductor chip size of a first embodiment.

FIG. 1 illustrates a basic perspective view of a power semiconductor component 1 of a semiconductor chip size of a first embodiment. The power semiconductor component 1 has a semiconductor chip 3 having on its rear side 7 a power electrode 14 as rear side electrode 13, which is the drain terminal D of a MOSFET component in this embodiment of the invention. The rear side electrode 13 is connected to one of the external contacts 9 on the top side 8 of the semiconductor chip 3 as top side power electrode 18 via a coating 4, which covers the rear side 7, the edge sides 5 and 6 and also partly the top side 8 of the semiconductor chip 3.

This means that the rear side electrode 13 can then be contact-connected from the top side 3 of the power semiconductor component 1. In this first embodiment of the invention, the power electrode 18 in the form of the coating 4 surrounds the semiconductor chip 3 in its edge regions. A further top side power electrode 18 is furthermore arranged in the center of the top side 8 of the semiconductor chip 3, the electrode constituting the source terminal S of a MOSFET power component. Finally, a small-area control electrode 19 forms the gate terminal G of the MOSFET power component. Consequently, all the electrodes of the power semiconductor chip 3 can be reached and connected from the top side 8 with the aid of the three surface-mountable external contacts 9.

By using the coating 4 of the edge regions of the semiconductor chip 3 on all sides, the drain terminal D can additionally serve as shielding of the semiconductor chip 3 against electromagnetic stray fields. In order to ensure that no pn-junctions are short-circuited by the coating 4 in particular on the edge sides 5 and 6, an insulation and passivation layer 11 is arranged between the coating 4 and the semiconductor material 10 in the region of the edge sides 5 and 6 and also the top side 8 of the semiconductor chip 3. Consequently, in this embodiment of the invention, the coating 4 serves as connecting element 12 between rear side 7 and top side 8 of the semiconductor chip 3 and practically forms a metallic housing of the semiconductor component 1 of semiconductor chip size.

Figure 2:
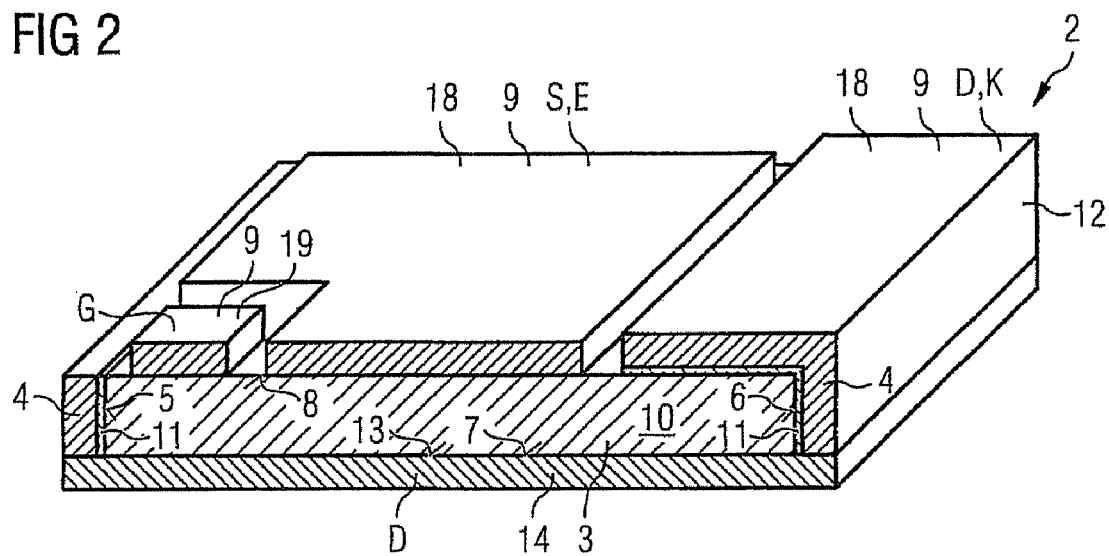
FIG. 2 illustrates a basic perspective view of a power semiconductor component of semiconductor chip size of a second embodiment.

FIG. 2 illustrates a basic perspective view of a power semiconductor component 2 of semiconductor chip size of a second embodiment. Components having the same functions as in FIG. 1 are identified by the same reference symbols and are not discussed separately. The difference from FIG. 1 is that, in the second embodiment of the invention, the coating 4 is used only as a connecting element 12 to a power electrode 18 as surface-mountable external contact 9 on the top side 8 of the semiconductor chip 3. Accordingly, the coating 4 is led to the top side 8 only in the region of the surface-mountable external contact 9 for the drain terminal D, while the remaining regions of the coating 4 only cover the edge sides 5 and 6 and the further edge regions—which are not visible in this perspective illustration—of the semiconductor chip 3. If a semiconductor chip 3 having an IGBT structure is used, then the large-area power electrodes 14 and 18 form an emitter terminal E and a collector terminal K instead of source S and drain D, respectively.

FIGS. 3 to 13 illustrate schematic cross sections through a portion of a semiconductor wafer 20 in the region of a separating joint 21 of a separating track 26 with coating 4 for the rear side 7, the edge sides 5 and 6 and partly for the top side 8 of semiconductor components in semiconductor device positions 25 of the semiconductor wafer 20.

Figure 3:
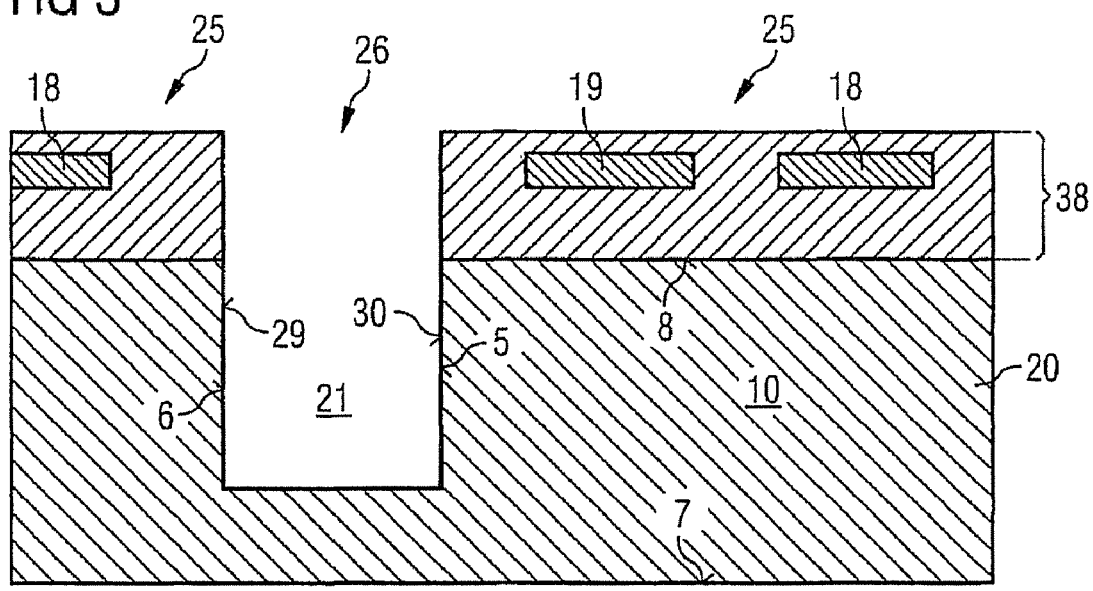
FIGS. 3 to 13 illustrate schematic cross sections through a portion of a semiconductor wafer in the region of a separating joint for the coating of the rear side, the edge sides and partly the top side of semiconductor components in semiconductor device positions.

FIG. 3 illustrates a schematic cross section through a portion of a semiconductor wafer 20 with an introduced separating joint 21 in the form of a separating groove that does not completely sever the semiconductor wafer 20, but rather only separates the active region of a power semiconductor component along the separating tracks 26 of the semiconductor wafer 20. The sidewalls 29 and 30 of the separating joint form during the introduction of the separating joint 21, the sidewalls forming the edge sides 5 and 6 of the power semiconductor chips of the power semiconductor components in the further course of the method. The top side 8 of the semiconductor wafer 20 is covered by a multilayered top side structure 38 on the semiconductor chip material 10, which structure here by way of example has a part of a power electrode 18 and also a control electrode 19.

Figure 4:
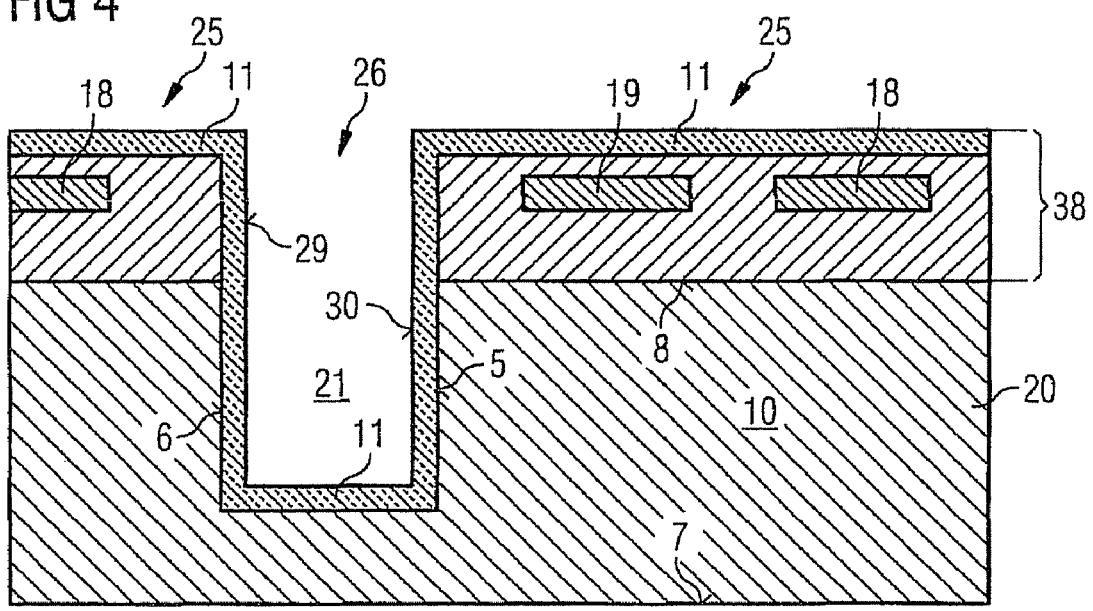

FIG. 4 illustrates a schematic cross section through the portion of the semiconductor wafer 20 in accordance with FIG. 3 after the application of an insulation and passivation layer 11. The insulation and passivation layer can be applied to the entire semiconductor wafer 20 with its semiconductor device positions 25 without masking and completely cover the sidewalls 29 and 30 of the separating joints 21 and also the bottom region. Such application of an insulation layer is effected by chemical vapor deposition or by a sputtering process.

Figure 5:
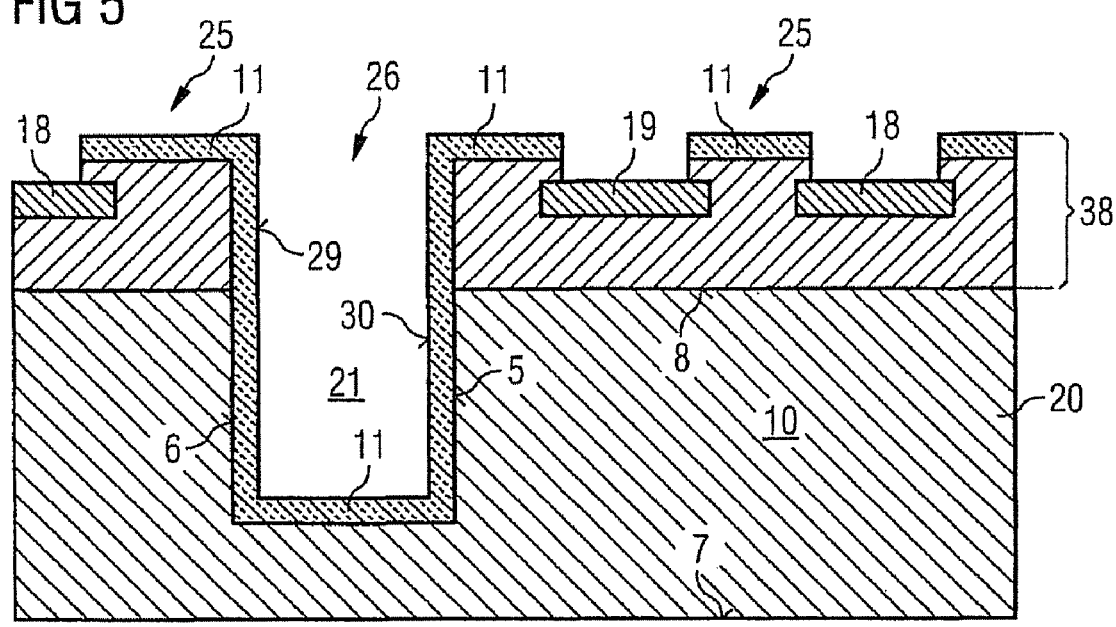

FIG. 5 illustrates a schematic cross section through the portion of the semiconductor wafer 20 in accordance with FIG. 4 after the patterning of the insulation and passivation layer 11. The patterning can be effected by using a photolithographic process in which firstly the top sides are protected by an insulation and passivation layer 11 against an etching attack by using a photoresist structure, while regions in which the electrodes 18 and 19 are to be uncovered are etched free. After this patterning and uncovering of the electrodes 18 and 19, a seed layer is then deposited.

Figure 6:
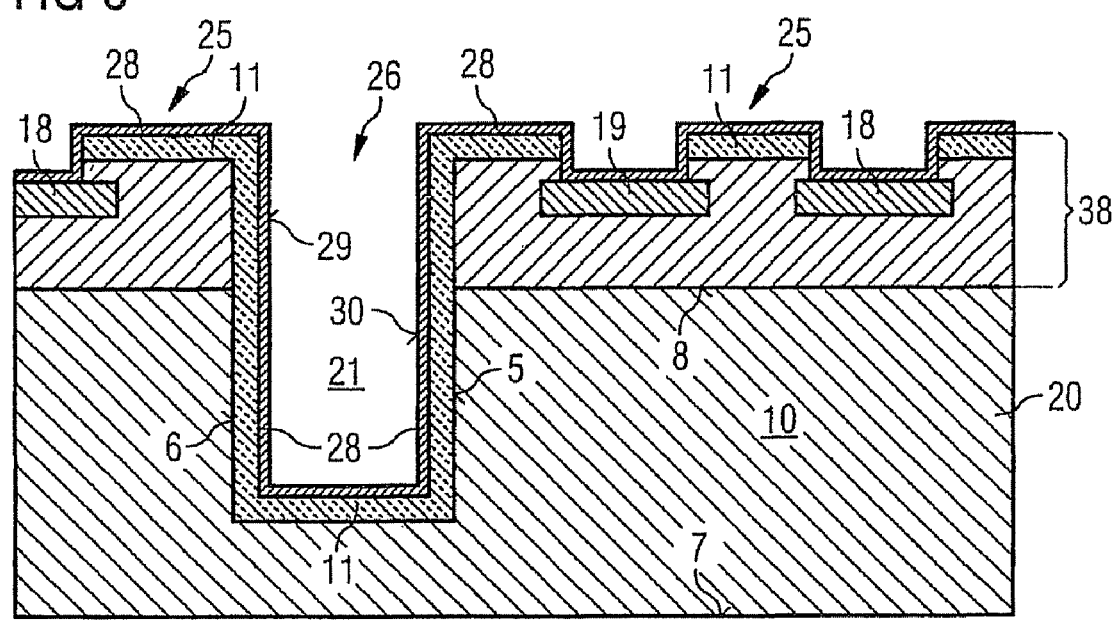

FIG. 6 illustrates a schematic cross section through the portion of the semiconductor wafer 20 in accordance with FIG. 5 after the application of an electrically conductive seed layer 28. The electrically conductive seed layer 28 can be applied by sputtering and include a highly doped polysilicon and/or graphite and/or a metal. The seed layer 28 is in turn applied to the entire semiconductor wafer 20 simultaneously for all the semiconductor component positions 25 and is initially not patterned since it serves to apply an electrical potential to the top side 8 of the semiconductor wafer 20.

Figure 7:
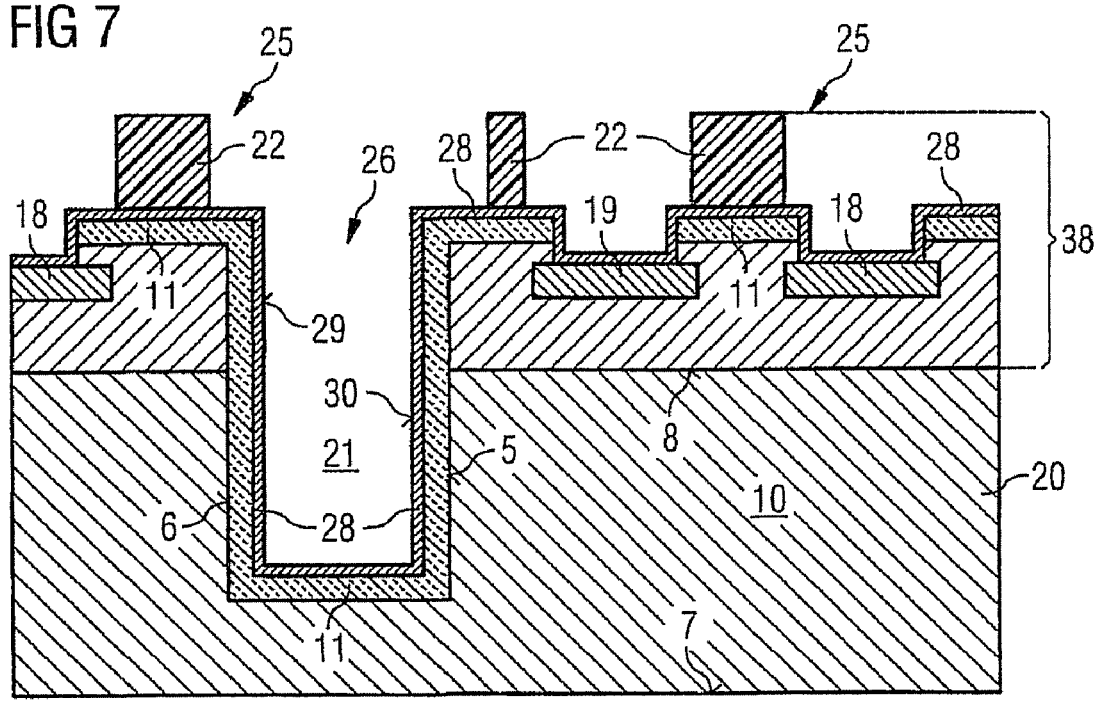

FIG. 7 illustrates a schematic cross section through the portion of the semiconductor wafer 20 in accordance with FIG. 6 after the application of a patterned resist protective layer 22. The resist protective layer 22 can in turn be patterned by a photolithographic process, wherein the regions of the top side of the semiconductor wafer 20 which are not intended to be coated with metal are protected against a deposition of a metallic layer. The seed layer 28 remains below the resist protective layer 22, however, in order to ensure a continuous electrical connection on the top side of the semiconductor wafer 20.

Figure 8:
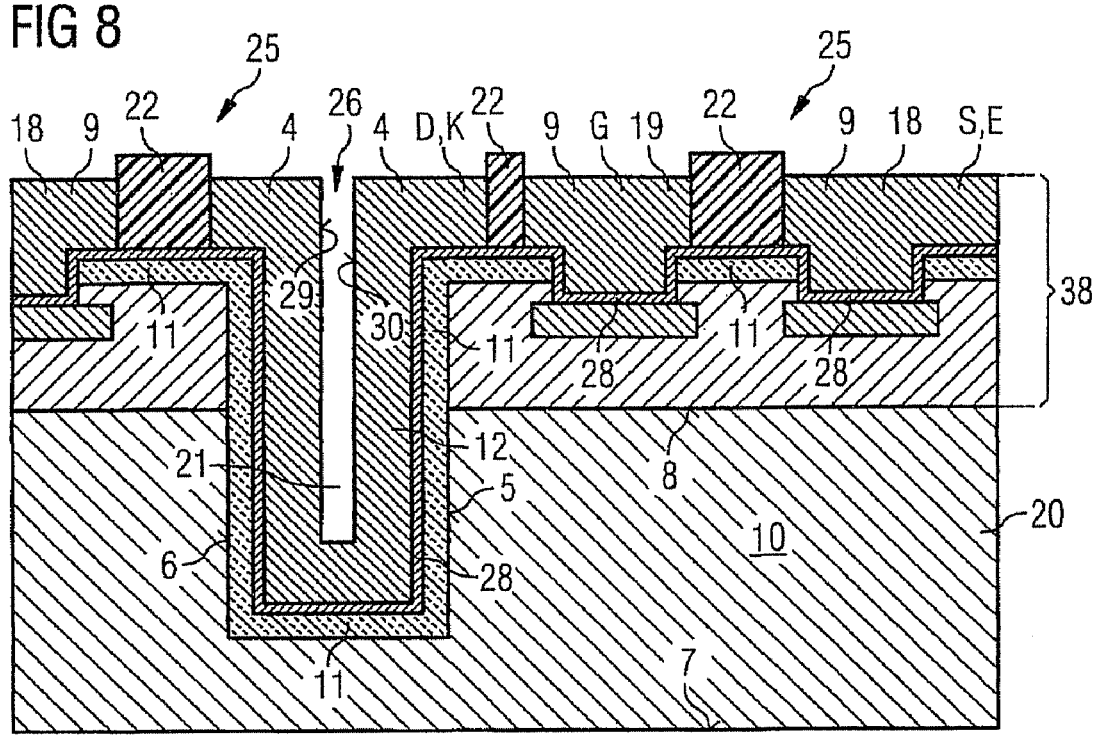

FIG. 8 illustrates a schematic cross section through the portion of the semiconductor wafer 20 in accordance with FIG. 7 after the deposition of a metallic coating 4 and surface-mountable external contacts 9. The metallic coating 4 in particular of the edge sides 5 and 6 of the semiconductor chip can clearly be seen in the region of the separating joints 21. However, it is also possible for the separating joints 21 to be completely grown over during the deposition of the coating 4. In order to grow such a layer composed of metal for external contacts 9 and coating 4, an isotropic growth for example in a galvanic or electrolytic bath is chosen, wherein the seed layer 28 is put at a corresponding electrical potential at which the metal ions of the coating 4 and of the surface-mountable external contacts 9 deposit. While the gate terminal G with a small-area control electrode 19 is delimited by the patterned resist protective layer 22, the deposited metal layer for the power electrode 18 forms a large-area structure that combines a multiplicity of individual source electrodes S in the top side structure 38 of the semiconductor wafer 20.

Figure 9:
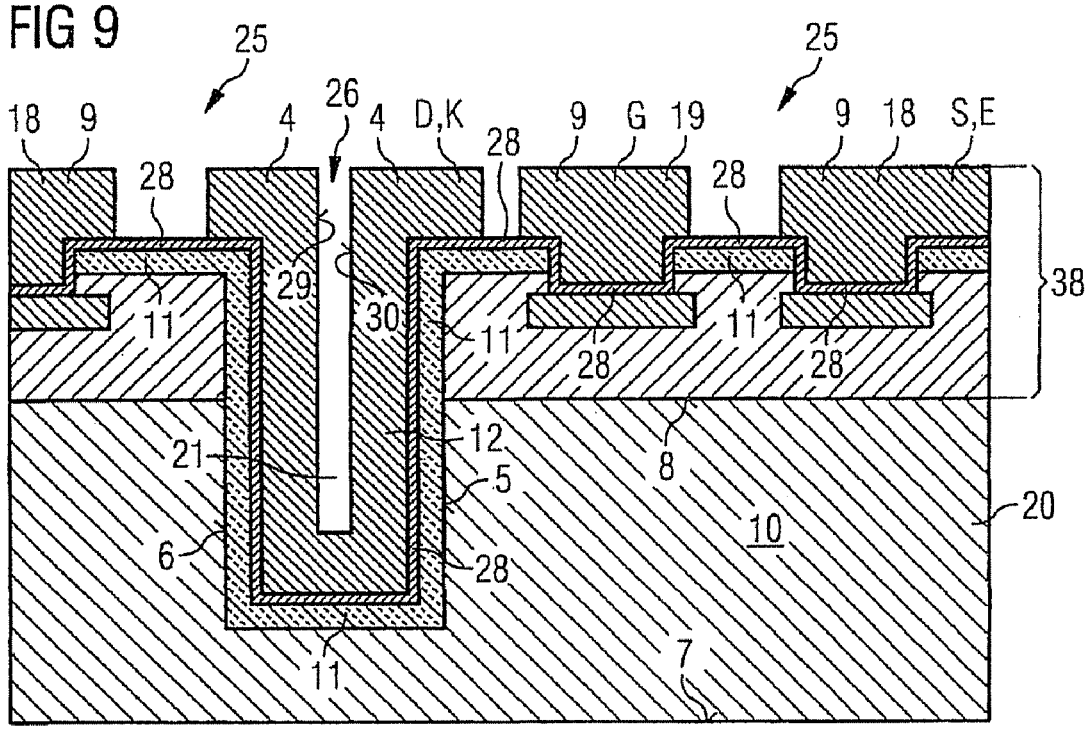

FIG. 9 illustrates a schematic cross section through the portion of the semiconductor wafer 20 in accordance with FIG. 8 after the removal of the resist protective layer structure. With the removal of the resist protective layer structure, the electrically conductive seed layer 28 is uncovered and can then be removed by a further dry etching method or wet etching method. Since the seed layer 28 has a small thickness, the seed layer 28 can be removed without additionally applying an etching mask, especially as the thickness of the external contacts 9 for source S, drain D and gate G is only minimized by the small thickness of the seed layer 28 during this removal of the seed layer 28.

Figure 10:
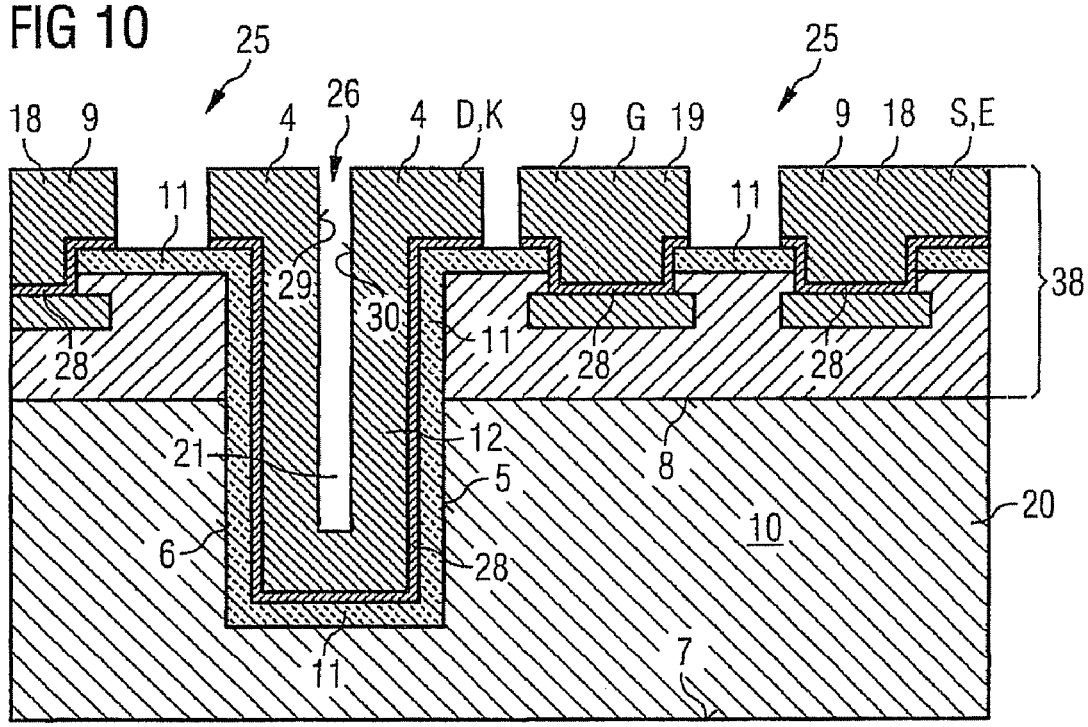

FIG. 10 illustrates a schematic cross section through the portion of the semiconductor wafer 20 in accordance with FIG. 9 after the removal of the electrically conductive seed layer. The etching away of the seed layer eliminates the short circuit that was originally provided by the seed layer 28 for the electrodeposition, with the result that the individual surface-mountable external contacts 9 are now no longer electrically short-circuited.

Figure 11:
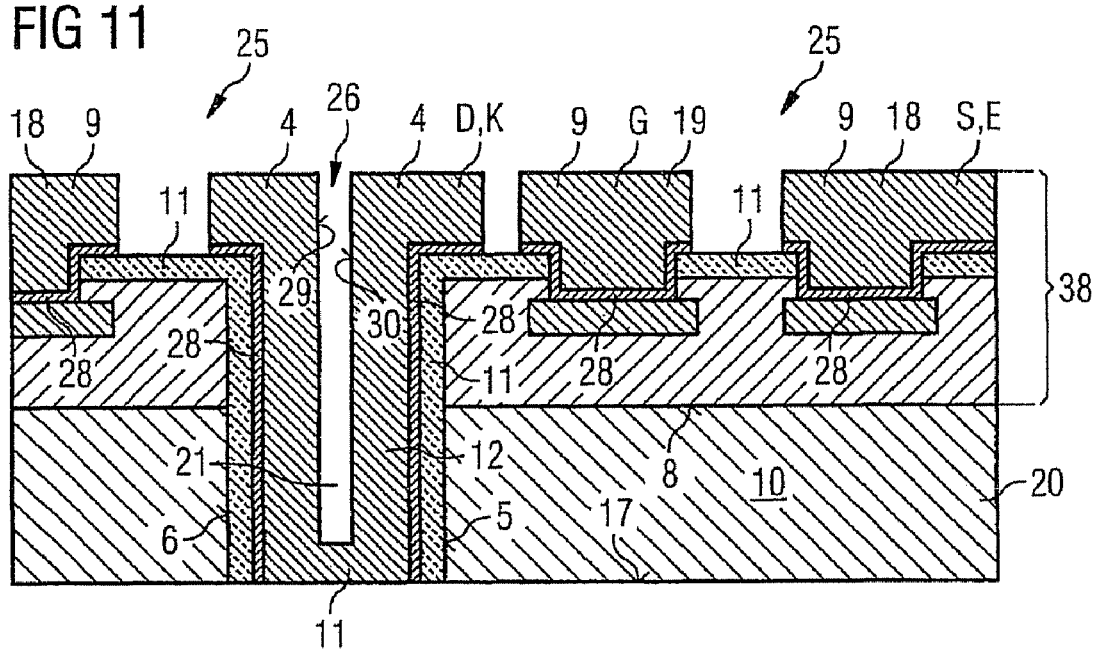

FIG. 11 illustrates a schematic cross section through the portion of the semiconductor wafer 20 in accordance with FIG. 10 after the thinning of the semiconductor wafer 20. The thinning of the semiconductor wafer 20 from its rear side gives rise to a rear side 17 which is no longer interlinked for the entire semiconductor wafer 20. Therefore, before the rear side 7 of the semiconductor wafer is actually thinned to form a thinned rear side 17, a corresponding carrier is applied to the completed external contacts 9 and fixed in such a way that the forces occurring during the CMP method (chemical mechanical polishing) do not cause the semiconductor wafer 20 to fall apart into individual semiconductor devices.

Figure 12:
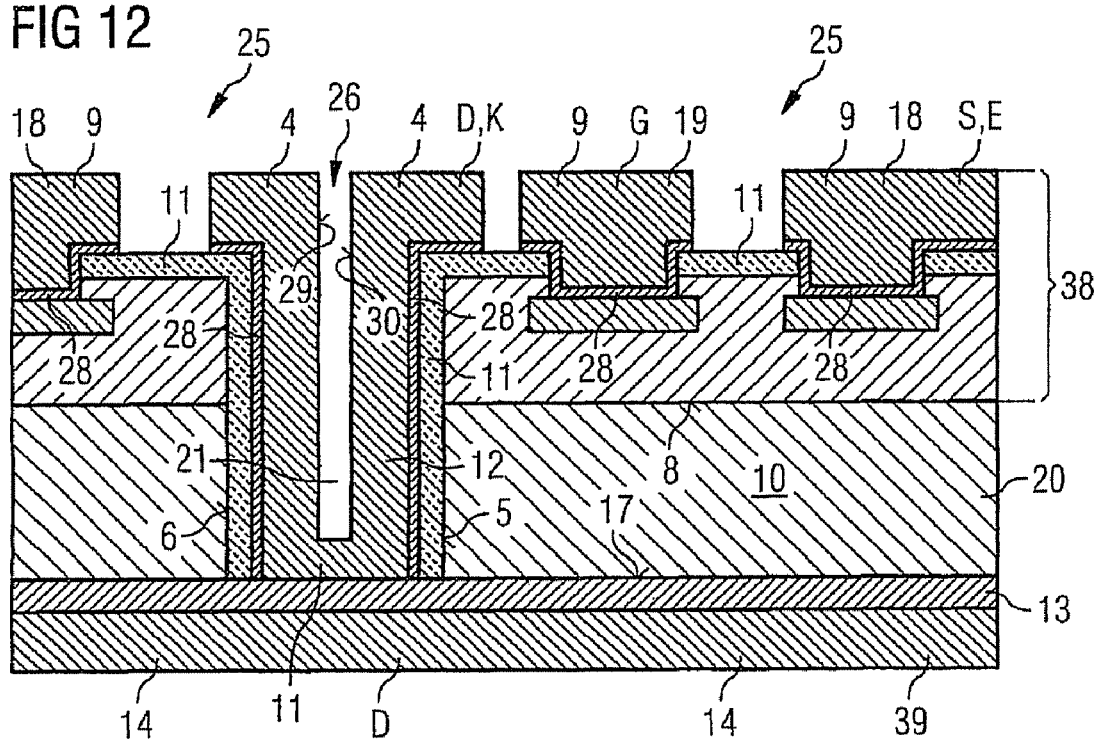

FIG. 12 illustrates a schematic cross section through the portion of the thinned semiconductor wafer 20 with its new rear side 17 in accordance with FIG. 11 after the metallization of the rear side 17 of the semiconductor wafer. For this purpose, beforehand or at the same time it is possible to introduce a rear side structure into the thinned rear side 17 and/or to carry out diffusion and ion implantation processes in order to achieve a specific rear side structure of the semiconductor chip material 10. The metallization can be applied with a thickness such that it contributes to the stability of the semiconductor components. Moreover, by using this metallization, the coating 4 is completed and a connecting element 12 is thus provided between the rear side 17 and the top side structure 38 arranged on the top side 8.

Figure 13:
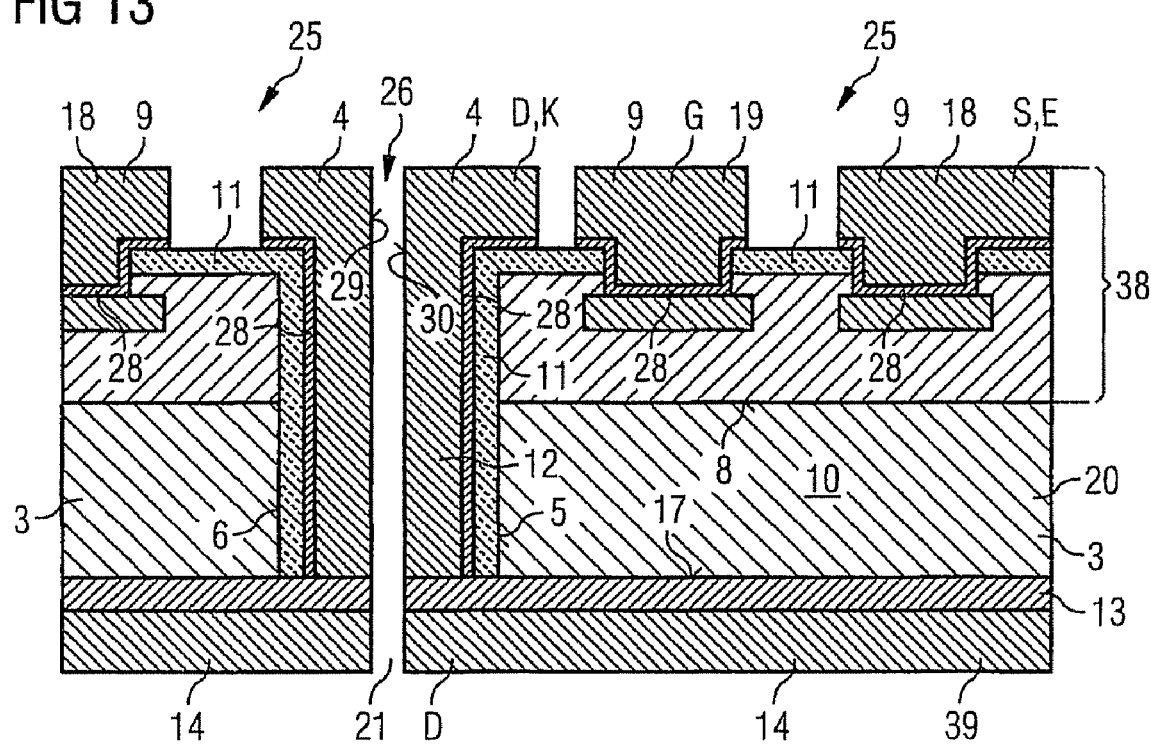

FIG. 13 illustrates a schematic cross section through the portion of the thinned semiconductor wafer 20 in accordance with FIG. 12 after the separation of the rear side metallization 39 into power electrodes 14, such that individual semiconductor components of semiconductor chip size with a metallic coating 4 are now present.

Figure 14:
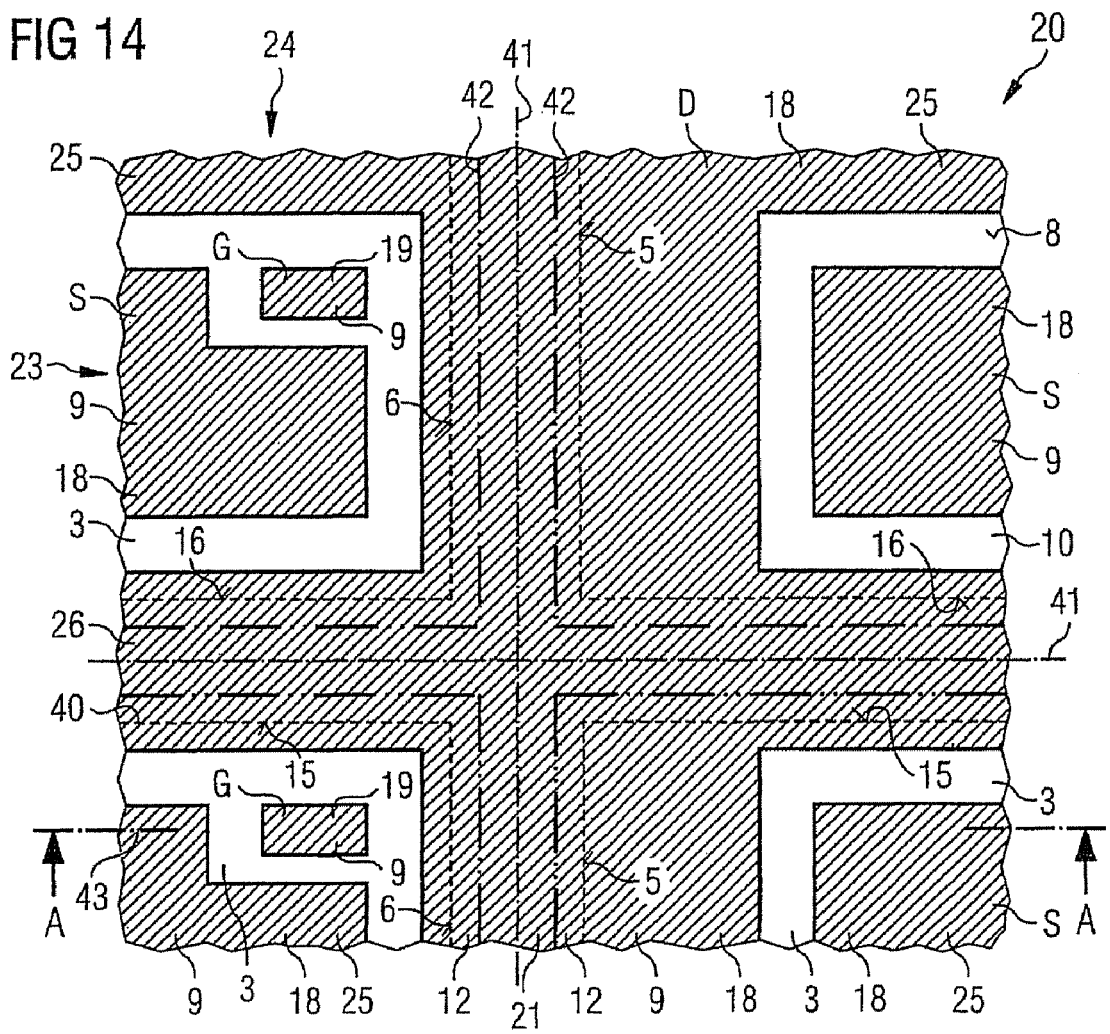
FIG. 14 illustrates a schematic plan view of the top side of a portion of a semiconductor wafer.

FIG. 14 illustrates a schematic plan view of the top side 8 of a portion of a semiconductor wafer 20 in the region in which two separating tracks 26 cross and thus illustrate the arrangement of the semiconductor chip positions 25 on the semiconductor wafer 20 in rows 23 and columns 24. The hatched regions illustrate superficial metallizations. The dashed lines 40 illustrate the edge sides 5, 6, 15 and 16 of the four semiconductor chips 3. The dash-dotted lines 41 illustrate the center line of the separating tracks 26. The double-dotted lines 42 mark the boundaries of the sawing tracks that are introduced, for separating the semiconductor devices, into the metal-filled separating joints 21 in order to separate the semiconductor components from one another. The triple-dotted line 43 is a sectional line A-A for marking the position of the cross section through the semiconductor wafer 20 of the subsequent figure.

Figure 15:
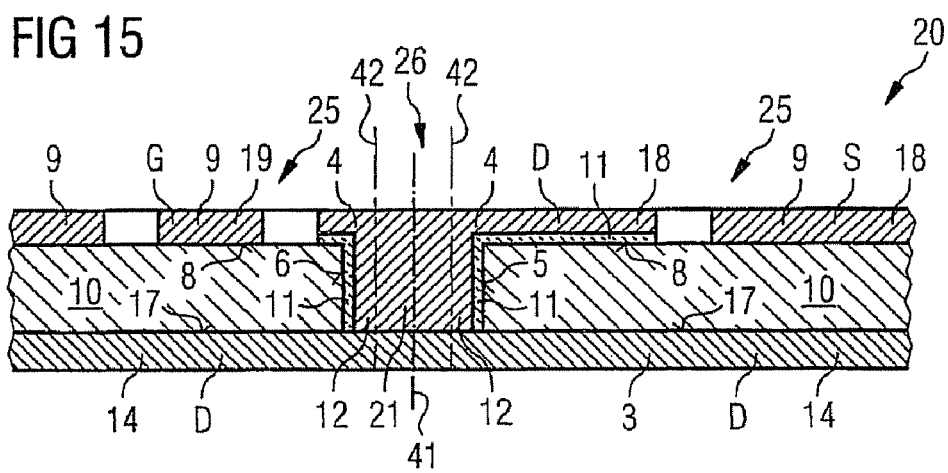
FIG. 15 illustrates a schematic cross section through the portion of the semiconductor wafer in accordance with FIG. 14 prior to a separation of the semiconductor wafer into individual semiconductor components.

FIG. 15 illustrates a schematic cross section through the portion of the semiconductor wafer 20 in accordance with FIG. 14 before the semiconductor wafer 20 is separated into individual semiconductor components. For this purpose, into the metal region that is intended to form the coating 4, a significantly narrower separation is performed along the separating joints 21 than during the introduction of separating joints into the semiconductor wafer, with the result that an coating 4 remains during the separation of the semiconductor wafer 20 for each of the semiconductor components of semiconductor chip size on the edge sides 5 and 6 along the double-dotted lines 42.

FIG. 16 illustrates a perspective view of a semiconductor component 27 in accordance with the prior art with a plastic coating 37 as has already been described in the introduction.

FIG. 17 illustrates a schematic cross section through a power semiconductor component 31 with through contacts 32 as connecting elements 12 through the semiconductor chip material 10 of a power semiconductor chip for connecting the rear side electrode 13 to surface-mountable external contacts 9 arranged on the top side 8 of the power semiconductor component 31 in the form of solder balls 35.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:
1. A method for producing a plurality of semiconductor components, the method comprising:
patterning a semiconductor wafer with semiconductor device structures with introduction of separating joints after fixing of the semiconductor wafer on a first carrier;
applying a resist protective layer structure to the semiconductor wafer in regions that are to be protected against a deposition of a metallic encapsulation and metallic external contacts;
depositing a metallic encapsulation and of metallic external contacts on the semiconductor wafer;
removing the resist protective layer structure;
fixing the semiconductor wafer by its top side on a second carrier and removal of the first carrier;
metallizing the rear side of the semiconductor wafer with completion of the encapsulation of rear sides, edge sides and regions of the top sides of the semiconductor components of the semiconductor wafer; and
detaching individual semiconductor components from the second carrier.

2. A method for producing a plurality of semiconductor components, the method comprising:
producing a semiconductor wafer with a large-area rear side electrode and with semiconductor chip positions arranged in rows and columns with semiconductor component structures and separating tracks arranged in between;
fixing the semiconductor wafer by its rear side on a first carrier;
introducing separating joints along the separating tracks;
applying an electrically conductive seed layer to the semiconductor wafer and the sidewalls of the separating joints;
applying a resist protective layer structure to the seed layer in regions that are to be protected against a deposition of a metallic encapsulation and a deposition of metallic external contacts;
depositing a metallic encapsulation and of metallic external contacts on the seed layer;
removing the resist protective layer structure and of the seed layer arranged underneath;
fixing the semiconductor wafer by its top side on a second carrier and removal of the first carrier;
metallizing the rear side of the semiconductor wafer with completion of the encapsulation of rear sides, edge sides and regions of the top sides of the semiconductor components in the semiconductor chip positions; and
detaching individual semiconductor components from the second carrier.

3. A method for producing a plurality of power semiconductor components, comprising:
producing a semiconductor wafer with power semiconductor chip positions which are arranged in rows and columns and which have a power electrode and a control electrode on the top side and a power electrode on the rear side, wherein separating tracks are arranged between the power semiconductor chip positions;
fixing the semiconductor wafer by its rear side on a first carrier;
introducing separating joints along the separating tracks;
applying an electrically conductive seed layer to the semiconductor wafer and the sidewalls of the separating joints;
applying a resist protective layer structure to the seed layer in regions that are to be protected against a deposition of a metallic encapsulation and the deposition of metallic external contacts;
depositing a metallic encapsulation and metallic external contacts on the seed layer;
removing the resist protective layer structure and of the seed layer arranged underneath;
fixing the semiconductor wafer by its top side on a second carrier and removal of the first carrier;
metallizing the rear side of the semiconductor wafer with completion of the encapsulation of rear sides, edge sides and regions of the top sides of the power semiconductor components in the semiconductor chip positions; and
detaching individual power semiconductor components from the second carrier.

4. The method of claim 3, wherein after the introduction of the separating joints, an insulation or passivation layer is applied to the semiconductor wafer and to the sidewalls of the separating joints.

5. The method of claim 3, wherein the separating joints do not sever the semiconductor wafer and, after the application of the second carrier, the semiconductor wafer is thinned until the separating joints are reached.

6. The method of claim 3, wherein an electroless chemical or an electrolytic metal deposition is carried out for the deposition of a metallic encapsulation and for the deposition of metallic external contacts.

7. The method of claim 3, wherein a sputtering method is used for the deposition of an electrically conductive seed layer.

8. The method of claim 3, wherein a plasma ashing is used for the removal of the resist protective layer structure.

9. The method of claim 3, wherein a solvent is used for the removal of the resist protective layer structure.

10. The method of claim 3, wherein a dry etching method is used for the removal of the seed layer.

* * * * *